(12) United States Patent
Chen et al.

(10) Patent No.: US 12,439,679 B2
(45) Date of Patent: Oct. 7, 2025

(54) FUSI GATED DEVICE FORMATION

(71) Applicant: Taiwan Semiconductor Manufacturing Company, Ltd., Hsin-Chu (TW)

(72) Inventors: Yi-Huan Chen, Hsin Chu (TW); Chien-Chih Chou, New Taipei (TW); Ta-Wei Lin, Minxiong Township (TW); Hsiao-Chin Tuan, Taowan (TW); Alexander Kalnitsky, San Francisco, CA (US); Kong-Beng Thei, Pao-Shan Village (TW); Chia-Hong Wu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/363,881

(22) Filed: Aug. 2, 2023

(65) Prior Publication Data
US 2023/0377992 A1    Nov. 23, 2023

Related U.S. Application Data

(60) Continuation of application No. 17/406,276, filed on Aug. 19, 2021, now Pat. No. 11,823,959, which is a
(Continued)

(51) Int. Cl.
*H10D 84/03* (2025.01)
*H01L 21/28* (2025.01)
(Continued)

(52) U.S. Cl.
CPC ..... *H10D 84/038* (2025.01); *H01L 21/28088* (2013.01); *H01L 21/31053* (2013.01);
(Continued)

(58) Field of Classification Search
CPC ..... H01L 21/823443; H01L 21/823456; H01L 21/823835; H01L 21/28052;
(Continued)

(56) References Cited

U.S. PATENT DOCUMENTS 5,358,879 A * 10/1994 Brady ............... H10D 64/671
438/304
5,686,331 A * 11/1997 Song ............... H10D 84/0137
438/303

(Continued)

OTHER PUBLICATIONS

Kadoshima, et al. "Dual Metal Gate Technology With Metal Inserted FUSI Stack (MIFS) Using Single Phase FUSI for Scaled High-K CMOSFETs." Extended Abstract of the 2008 International Conference on Solid State Devices and Materials, Tsukuba, 2008, pp. 846-847.

(Continued)

*Primary Examiner* — Sophia T Nguyen
(74) *Attorney, Agent, or Firm* — Eschweiler & Potashnik, LLC

(57) ABSTRACT

Various embodiments of the present disclosure are directed towards a method for forming an integrated chip. The method includes forming a stack of gate layers over a substrate. The stack of gate layers includes a first dielectric layer on the substrate, a conductive layer on the first dielectric layer, and a polysilicon layer on the conductive layer. A pair of source/drain regions is formed on opposing sides of a central region of the polysilicon layer. The central portion of the polysilicon layer is converted to a first silicide layer. The first silicide layer is spaced between inner sidewalls of the polysilicon layer.

20 Claims, 9 Drawing Sheets

Related U.S. Application Data division of application No. 16/169,220, filed on Oct. 24, 2018, now Pat. No. 11,133,226.

(60) Provisional application No. 62/748,709, filed on Oct. 22, 2018.

(51) Int. Cl.

| | |
|---|---|
| *H01L 21/3105* | (2006.01) |
| *H01L 21/3213* | (2006.01) |
| *H10D 30/01* | (2025.01) |
| *H10D 62/13* | (2025.01) |
| *H10D 64/27* | (2025.01) |
| *H10D 64/62* | (2025.01) |
| *H10D 64/66* | (2025.01) |
| *H10D 64/68* | (2025.01) |
| *H10D 84/01* | (2025.01) |
| *H10D 84/85* | (2025.01) |

(52) U.S. Cl.
CPC .. *H01L 21/32133* (2013.01); *H01L 21/32139* (2013.01); *H10D 30/0212* (2025.01); *H10D 30/0215* (2025.01); *H10D 62/151* (2025.01); *H10D 64/517* (2025.01); *H10D 64/62* (2025.01); *H10D 64/667* (2025.01); *H10D 64/685* (2025.01); *H10D 84/017* (2025.01); *H10D 84/0174* (2025.01); *H10D 84/0186* (2025.01); *H10D 84/85* (2025.01); *H10D 64/514* (2025.01); *H10D 64/691* (2025.01)

(58) Field of Classification Search
CPC .......... H01L 21/28061; H10D 30/0212; H10D 30/0213; H10D 30/0215; H10D 84/0137; H10D 84/0174; H10D 84/0177; H10D 84/014; H10D 64/663

See application file for complete search history.

(56) References Cited

U.S. PATENT DOCUMENTS

| | | | |
|---|---|---|---|
| 5,714,414 A | 2/1998 | Lee et al. | |
| 5,739,573 A | 4/1998 | Kawaguchi | |
| 6,051,470 A | 4/2000 | An et al. | |
| 6,069,032 A | 5/2000 | Lee | |
| 6,100,142 A * | 8/2000 | Liao | H10D 64/518 |
| | | | 257/E21.205 |
| 6,111,319 A | 8/2000 | Liou et al. | |
| 6,165,880 A | 12/2000 | Yaung et al. | |
| 6,177,317 B1 | 1/2001 | Huang et al. | |
| 6,312,995 B1 | 11/2001 | Yu | |
| 6,329,256 B1 * | 12/2001 | Ibok | H10D 30/0225 |
| | | | 438/584 |
| 6,359,321 B2 * | 3/2002 | Shimizu | H01L 21/28114 |
| | | | 257/E21.205 |
| 6,387,789 B1 * | 5/2002 | Kim | H01L 29/66553 |
| | | | 257/E21.205 |
| 6,747,328 B2 * | 6/2004 | Wu | H01L 21/28105 |
| | | | 257/408 |
| 7,279,735 B1 | 10/2007 | Yu et al. | |
| 7,285,829 B2 | 10/2007 | Doyle et al. | |
| 7,435,669 B2 * | 10/2008 | Kim | H01L 29/6653 |
| | | | 438/549 |
| 7,439,134 B1 | 10/2008 | Prinz et al. | |
| 7,465,996 B2 | 12/2008 | Satou et al. | |
| 7,560,753 B2 | 7/2009 | Anderson et al. | |
| 7,755,145 B2 | 7/2010 | Sato et al. | |
| 7,812,400 B2 * | 10/2010 | Liaw | H01L 21/823475 |
| | | | 257/369 |
| 8,872,285 B2 | 10/2014 | Scheiper et al. | |
| 8,969,941 B2 | 3/2015 | Sakamoto | |
| 9,508,721 B2 * | 11/2016 | Zhu | H01L 21/823864 |
| 11,133,226 B2 * | 9/2021 | Chen | H10D 30/601 |
| 11,823,959 B2 * | 11/2023 | Chen | H10D 64/518 |
| 2001/0042882 A1 | 11/2001 | Chang et al. | |
| 2002/0020860 A1 | 2/2002 | Arai | |
| 2003/0235990 A1 * | 12/2003 | Wu | H01L 21/28061 |
| | | | 257/E21.2 |
| 2004/0004259 A1 * | 1/2004 | Wu | H01L 21/28105 |
| | | | 257/411 |
| 2004/0023478 A1 | 2/2004 | Samavedam et al. | |
| 2004/0065959 A1 | 4/2004 | Park | |
| 2004/0110377 A1 | 6/2004 | Cho et al. | |
| 2005/0156238 A1 | 7/2005 | Wen et al. | |
| 2005/0263830 A1 * | 12/2005 | Wang | H01L 29/66545 |
| | | | 257/E29.151 |
| 2006/0068553 A1 * | 3/2006 | Thean | H01L 29/66787 |
| | | | 257/E21.442 |
| 2006/0102962 A1 | 5/2006 | Saito | |
| 2006/0148181 A1 | 7/2006 | Chan et al. | |
| 2006/0214226 A1 * | 9/2006 | Chen | H01L 29/045 |
| | | | 438/149 |
| 2006/0244079 A1 * | 11/2006 | Wang | H01L 21/845 |
| | | | 257/407 |
| 2006/0255405 A1 | 11/2006 | Tsui et al. | |
| 2006/0273410 A1 | 12/2006 | Park et al. | |
| 2007/0007564 A1 | 1/2007 | Hayashi et al. | |
| 2007/0045695 A1 * | 3/2007 | Takeoka | H01L 21/82345 |
| | | | 257/296 |
| 2007/0057331 A1 * | 3/2007 | Satou | H01L 21/823456 |
| | | | 257/E21.624 |
| 2007/0075374 A1 * | 4/2007 | Kudou | H01L 27/0629 |
| | | | 257/E21.624 |
| 2007/0080405 A1 | 4/2007 | Kotani et al. | |
| 2007/0093015 A1 | 4/2007 | Kudo et al. | |
| 2007/0096183 A1 * | 5/2007 | Ogawa | H01L 27/0629 |
| | | | 257/300 |
| 2007/0132004 A1 | 6/2007 | Yasuda et al. | |
| 2007/0134898 A1 | 6/2007 | Takeoka et al. | |
| 2007/0164342 A1 * | 7/2007 | Okazaki | H10B 69/00 |
| | | | 257/314 |
| 2007/0210351 A1 | 9/2007 | Tsuchiya et al. | |
| 2007/0221999 A1 * | 9/2007 | Wu | H01L 29/7835 |
| | | | 257/E29.268 |
| 2007/0264810 A1 * | 11/2007 | Kim | H01L 29/66545 |
| | | | 257/E29.085 |
| 2008/0017927 A1 | 1/2008 | Ohkawa | |
| 2008/0067495 A1 | 3/2008 | Verhulst | |
| 2008/0067607 A1 | 3/2008 | Verhulst et al. | |
| 2008/0128825 A1 | 6/2008 | Sato et al. | |
| 2008/0173927 A1 | 7/2008 | Sakuma et al. | |
| 2008/0179654 A1 * | 7/2008 | Sato | H10B 41/30 |
| | | | 257/E21.624 |
| 2008/0230855 A1 * | 9/2008 | Liaw | H01L 21/823475 |
| | | | 257/412 |
| 2009/0001477 A1 | 1/2009 | Hsu et al. | |
| 2009/0007037 A1 | 1/2009 | Hsu et al. | |
| 2009/0014813 A1 * | 1/2009 | Chao | H01L 21/28097 |
| | | | 257/407 |
| 2009/0020800 A1 * | 1/2009 | Tempel | H01L 29/66825 |
| | | | 257/E21.409 |
| 2009/0045469 A1 | 2/2009 | Takahashi | |
| 2009/0053883 A1 | 2/2009 | Colombo et al. | |
| 2009/0090977 A1 * | 4/2009 | Freeman | H01L 28/20 |
| | | | 438/383 |
| 2009/0115000 A1 | 5/2009 | Hwang | H10D 30/0227 |
| | | | 257/408 |
| 2009/0140315 A1 * | 6/2009 | Kuniya | H10B 41/40 |
| | | | 438/266 |
| 2009/0140317 A1 | 6/2009 | Rosmeulen | |
| 2009/0261415 A1 | 10/2009 | Adkisson et al. | |
| 2009/0298273 A1 | 12/2009 | Lee et al. | |
| 2009/0302390 A1 | 12/2009 | Van Dal et al. | |
| 2010/0006914 A1 * | 1/2010 | Nakagawa | H10B 43/30 |
| | | | 438/259 |
| 2010/0016620 A1 | 1/2010 | Dussarrat | |
| 2010/0044770 A1 | 2/2010 | Lee | |
| 2010/0059817 A1 | 3/2010 | Pham et al. | |
| 2010/0072534 A1 * | 3/2010 | Nagano | H10B 41/35 |
| | | | 257/E21.422 |

(56) References Cited

U.S. PATENT DOCUMENTS

| | | | |
|---|---|---|---|
| 2010/0078733 A1 | 4/2010 | Masuoka et al. | |
| 2010/0084719 A1 | 4/2010 | Masuoka et al. | |
| 2010/0283107 A1* | 11/2010 | Muller | H01L 29/4983 |
| | | | 257/E21.409 |
| 2010/0328022 A1* | 12/2010 | Fan | H01L 28/20 |
| | | | 257/E21.409 |
| 2011/0049639 A1 | 3/2011 | Doornbos et al. | |
| 2011/0097867 A1 | 4/2011 | Lin et al. | |
| 2011/0108930 A1 | 5/2011 | Cheng et al. | |
| 2011/0115013 A1 | 5/2011 | Lee | |
| 2011/0121381 A1 | 5/2011 | Kanemura et al. | |
| 2011/0248343 A1 | 10/2011 | Guo et al. | |
| 2011/0284968 A1 | 11/2011 | Lee et al. | |
| 2012/0001249 A1 | 1/2012 | Alsmeier et al. | |
| 2012/0155187 A1 | 6/2012 | Shelton et al. | |
| 2012/0217553 A1* | 8/2012 | Luo | H01L 29/7834 |
| | | | 257/E21.409 |
| 2012/0313187 A1 | 12/2012 | Baars et al. | |
| 2013/0115766 A1 | 5/2013 | Nakazawa | |
| 2013/0140442 A1 | 6/2013 | Yangita et al. | |
| 2013/0146989 A1* | 6/2013 | Hong | H01L 27/0629 |
| | | | 257/379 |
| 2013/0221423 A1 | 8/2013 | Kawasaki et al. | |
| 2013/0241001 A1* | 9/2013 | Chen | H01L 27/0629 |
| | | | 438/653 |
| 2013/0299919 A1 | 11/2013 | Chen et al. | |
| 2014/0117465 A1 | 5/2014 | Huang et al. | |
| 2014/0159135 A1 | 6/2014 | Fujimoto et al. | |
| 2014/0167110 A1* | 6/2014 | Javorka | H10D 30/0225 |
| | | | 257/192 |
| 2014/0231908 A1* | 8/2014 | Chen | H10D 30/0281 |
| | | | 438/286 |
| 2014/0291769 A1 | 10/2014 | Zhu et al. | |
| 2015/0162414 A1 | 6/2015 | Boschke et al. | |
| 2015/0179753 A1* | 6/2015 | Boschke | H01L 23/62 |
| | | | 257/529 |
| 2016/0056250 A1* | 2/2016 | Chuang | H01L 29/42344 |
| | | | 257/326 |
| 2016/0064382 A1 | 3/2016 | Javorka et al. | |
| 2016/0086964 A1 | 3/2016 | Chien et al. | |
| 2016/0163815 A1 | 6/2016 | Hoentschel et al. | |
| 2016/0181266 A1* | 6/2016 | Chuang | H01L 29/7883 |
| | | | 257/316 |
| 2016/0254358 A1 | 9/2016 | Tsai et al. | |
| 2016/0343712 A1 | 11/2016 | Xu | |
| 2016/0351673 A1 | 12/2016 | Lai et al. | |
| 2017/0117380 A1 | 4/2017 | Lu et al. | |
| 2018/0012890 A1* | 1/2018 | Li | H01L 29/42364 |
| 2018/0175170 A1 | 6/2018 | Tsai et al. | |
| 2018/0204944 A1 | 7/2018 | Schippel et al. | |
| 2019/0081048 A1 | 3/2019 | Feng et al. | |
| 2019/0097013 A1 | 3/2019 | Chen et al. | |
| 2019/0103367 A1 | 4/2019 | Chen et al. | |
| 2020/0126870 A1* | 4/2020 | Chen | H01L 21/28088 |
| 2021/0384082 A1* | 12/2021 | Chen | H01L 21/76897 |
| 2023/0377992 A1* | 11/2023 | Chen | H01L 21/32133 |

OTHER PUBLICATIONS

Non-Final Office Action dated Apr. 13, 2020 for U.S. Appl. No. 16/169,220.

Final Office Action dated Aug. 26, 2020 for U.S. Appl. No. 16/169,220.

Notice of Allowance dated May 25, 2021 for U.S. Appl. No. 16/169,220.

Non-Final Office Action dated Mar. 29, 2023 for U.S. Appl. No. 17/406,276.

Notice of Allowance dated Jul. 18, 2023 for U.S. Appl. No. 17/406,276.

\* cited by examiner

FUSI GATED DEVICE FORMATION

REFERENCE TO RELATED APPLICATIONS

This application is a Continuation of U.S. application Ser. No. 17/406,276, filed on Aug. 19, 2021, which is a Divisional of U.S. application Ser. No. 16/169,220, filed on Oct. 24, 2018 (now U.S. Pat. No. 11,133,226, issued on Sep. 28, 2021), which claims the benefit of U.S. Provisional Application No. 62/748,709, filed on Oct. 22, 2018. The contents of the above-referenced Patent Applications are hereby incorporated by reference in their entirety.

BACKGROUND

Many modern-day electronic devices contain metal-oxide-semiconductor field-effect transistors (MOSFETs). A MOSFET has a gate structure arranged over a substrate between a source region and a drain region. A voltage applied to a gate electrode of the gate structure determines the conductivity of the MOSFET. Gate structures with a fully silicided (FUSI) gate electrode are a promising candidate for next generation MOSFET devices due to advantages with scaling high κ MOSFET devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
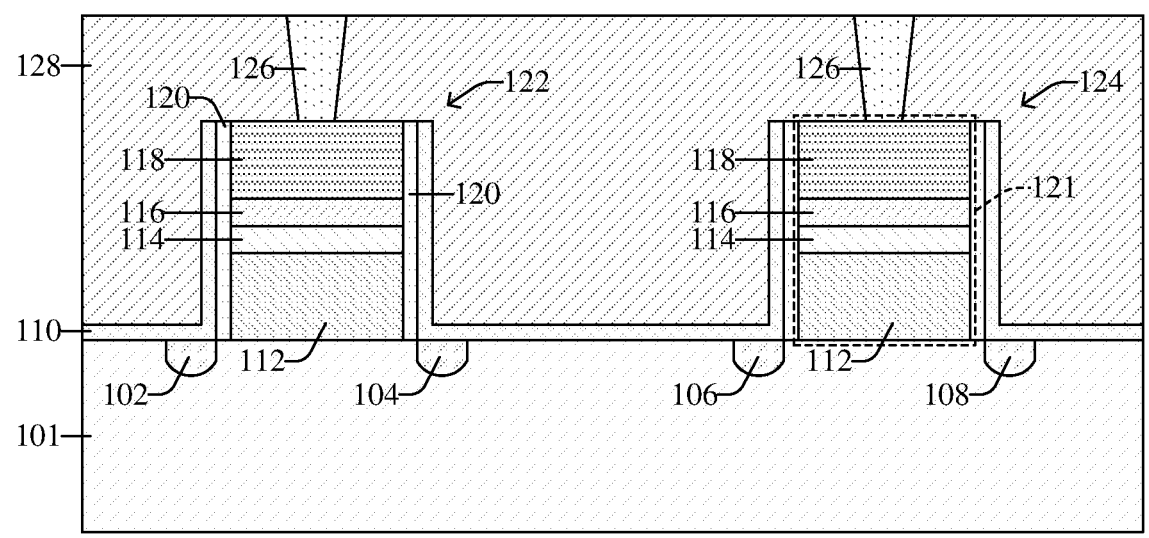
FIG. 1 illustrates a cross-sectional view of some embodiments of an integrated circuit (IC) including two MOSFET devices respectively comprising a thin FUSI layer over a metal layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A typical metal-oxide-semiconductor field-effect transistor (MOSFET) includes a gate structure over a well region within a substrate. Source and drain regions are located in the substrate on opposing sides of a channel region underlying the gate structure. The gate structure comprises a gate electrode disposed over a gate dielectric layer. Applying a voltage from the gate electrode to the source and drain regions varies a resistance of the MOSET. Increasing the voltage increases the concentration of charge carriers (e.g., electrons) in the channel region, thereby reducing resistance between the source and drain regions.

Over the last two decades, MOFSET transistors have typically used gate structures comprising polysilicon. In recent years, high κ metal gate (HKMG) transistors have begun to see widespread use due to their ability to further enable scaling and improve performance of a MOSFET device. However, it is challenging to embed low voltage and high voltage devices together using HKMG replacement gate processes. One alternative to HKMG is to use fully silicided (FUSI) gates. During fabrication of a MOSFET having a FUSI gate, a polysilicon layer is formed over the gate dielectric layer, and a metal layer is formed over the polysilicon layer. An annealing process is performed to convert the polysilicon layer and metal layer into a fully silicided (FUSI) gate electrode of the gate structure. Subsequently, the source and drain regions are formed on opposing sides of the gate structure. Conductive contacts are disposed over the FUSI gate electrode, and the source and drain regions. Overlying metal wires are subsequently formed within an inter-level-dielectric (ILD) layer over the conductive contacts.

Ideally, a relatively thin layer of polysilicon is used during FUSI processes. This is because a thick polysilicon layer will lead to processing issues during the annealing process. For example, if the polysilicon layer is too thick (e.g. greater than approximately 600 Angstroms), and not uniform in thickness, then the annealing process will not be able to convert the entire polysilicon layer into the FUSI gate electrode, leaving portions (e.g. within a center region of the FUSI gate electrode) of the FUSI gate electrode as polysilicon and degrading performance of the MOSFET device. However, it has been appreciated that after forming a thin polysilicon layer over the gate dielectric layer there will be grain boundaries that result in hump defects having an elevated height. The hump defects cause non-uniformities in height of the polysilicon layer over an array of MOSFET devices on the substrate, which will also lead to processing issues during the annealing process.

The present disclosure, in some embodiments, relates to a method of forming a MOSFET device that includes forming a gate structure comprising a first dielectric layer (e.g. the first dielectric layer comprising a high κ dielectric) over the gate dielectric layer, forming a metal layer over the first dielectric layer (e.g. the metal layer comprising TiN), and forming a polysilicon layer over the metal layer. The polysilicon layer forms on the metal layer uniformly and defect free, hereby removing any potential hump defect issues. Source and drain regions are formed on opposing sides of the gate structure. A second dielectric layer is formed over the gate structure and the source and drain regions. A planarization and etch process are performed to expose an upper surface of the polysilicon layer. A conductive layer is formed over the upper surface of the polysilicon layer and an annealing process is performed to convert the polysilicon layer and conductive layer into a FUSI layer. Formation of the polysilicon layer on the metal layer allows the polysilicon layer to be thin (e.g. having a thickness of approximately less than 300 Angstroms) and substantially uniform in thickness, ensuring the annealing process silicides an entire thickness of the polysilicon layer directly below the conductive layer.

Referring to FIG. 1, a cross-sectional view of an integrated circuit (IC) 100 in accordance with some embodiments is provided.

The IC 100 includes a substrate 101 with a first MOSFET device 122 and a second MOSFET device 124 disposed over and within the substrate 101. An etch stop layer 110 is disposed over the substrate 101 and around sidewalls of the first and second MOSFET devices 122, 124. A first inter-level dielectric (ILD) layer 128 is disposed over the first and second MOSFET devices 122, 124 and the etch stop layer 110.

The first and second MOSFET devices 122, 124 respectively comprise a gate structure 121. The gate structure 121 includes a gate dielectric layer 112, a first dielectric layer 114, a metal layer 116, and a fully silicided (FUSI) layer 118. The gate dielectric layer 112 is in direct contact with the substrate 101. The first dielectric layer 114 overlies the gate dielectric layer 112. The metal layer 116 overlies the first dielectric layer 114. The FUSI layer 118 overlies the metal layer 116. In some embodiments, the FUSI layer 118 is relatively thin and uniform in thickness, for example, a thickness at each point between a top surface of the FUSI layer 118 and a respective bottom surface of the FUSI layer 118 varies within a range of approximately −15 Angstroms to +15 Angstroms. In some embodiments, the FUSI layer 118 is formed to a thickness within a range of approximately 150 Angstroms to approximately 300 Angstroms. In other embodiments, the FUSI layer 118 is formed to a thickness within a range of approximately 225 Angstroms to approximately 300 Angstroms. In some embodiments, the FUSI layer 118 is entirely silicided so that no unsilicided polysilicon material exists between the top and bottom surfaces of the FUSI layer 118. In some embodiments, the metal layer 116 comprises titanium nitride (TiN). A sidewall spacer 120 surrounds sidewalls of respective individual layers in the gate structure 121. First conductive contacts 126 respectively overlie the FUSI layer 118 of the first and second MOSFET devices 122, 124.

A first source/drain region 102 and a second source/drain region 104 are disposed on opposing sides of the gate structure 121 of the first MOSTEFT device 122. A third source/drain region 106 and a fourth source/drain region 108 are disposed on opposing sides of the gate structure 121 of the second MOSFET device 124. The first, second, third, and fourth source/drain regions 102, 104, 106, 108 are disposed within the substrate 101. The first and second source/drain regions 102, 104 have a first doping type. The third and fourth source/drain regions 106, 108 have a second doping type. In some embodiments, the first and second doping types are the same. In yet another embodiment, the first doping type is P+-type and the second doping type is N+-type, or vice versa.

In some embodiments, the first and second MOSFET devices 122, 124 may comprise high voltage devices. High voltage technology has been widely used in power management, regulator, battery protector, DC motor, automotive relative, panel display driver (STN, TFT, OLED, etc), color display driver, power supply relative, Telecom, and the like. In some embodiments, the disclosed MOFSET devices may comprise symmetrical and asymmetrical laterally diffused MOSFET (LDMOS), double-diffused MOSFET (DMOS) devices, or the like. The thin and uniform FUSI layer 118 overlying the metal layer 116 ensures low voltage and high voltage devices can be embedded together.

Having the FUSI layer 118 overlie the metal layer 116 allows the FUSI layer 118 to have a relatively thin and uniform thickness (e.g. a thickness less than or equal to approximately 300 Angstroms or within a range of approximately 150 Angstroms to 300 Angstroms). This relatively thin and uniform thickness ensures an entire thickness of the FUSI layer 118 is completely silicided and mitigates processing issues related to the thickness of the FUSI layer 118. Having the metal layer 116 ensures that MOSFET devices of opposite doping types can be embedded on the same platform with minimal defects (e.g. preventing hump defects) within the FUSI layer 118 (e.g. specifically in high voltage applications, with a voltage in a range of approximately 6 V to 32 V).

Figure 2:
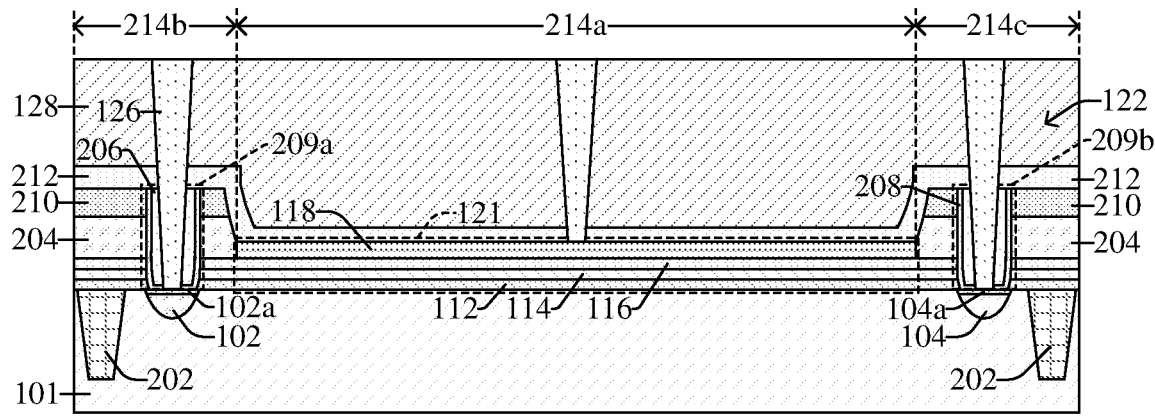
FIG. 2 illustrates a cross-sectional view of some embodiments of IC including a MOSFET device with a thin FUSI layer over a metal layer.

FIG. 2 illustrates a cross-sectional view of some additional embodiments of an IC 200.

The IC 200 includes a substrate 101 with a first MOSFET device 122 disposed over and within the substrate 101. The substrate 101 may be, for example, a bulk substrate (e.g., a bulk silicon substrate), a silicon-on-insulator (SOI) substrate, P doped silicon, or N doped silicon. A second dielectric layer 212 overlies the first MOSFET device 122. A first ILD layer 128 is disposed over the second dielectric layer 212.

The first MOSFET device 122 comprises a gate structure 121. The gate structure 121 includes a gate dielectric layer 112, a first dielectric layer 114, a metal layer 116 and a fully silicided (FUSI) layer 118. The gate dielectric layer 112 is in direct contact with the substrate 101. In some embodiments, the gate dielectric layer 112 may, for example, be or comprise an oxide (e.g. silicon oxide, silicon oxy-nitride, or the like), a high κ dielectric (e.g. hafnium oxide, zirconium silicate, or the like), or any combination of the foregoing formed to a thickness of approximately 208 Angstroms or within a range of approximately 50 Angstroms to approximately 250 Angstroms. The first dielectric layer 114 overlies the gate dielectric layer 112. In some embodiments, the first dielectric layer 114 may, for example, be or comprise a high κ dielectric, hafnium oxide ($HfO_2$), zirconium oxide ($ZrO_2$), or any combination of the foregoing formed to a thickness of approximately 10 Angstroms, 20 Angstroms, or within a range of approximately 5 Angstroms to approximately 25 Angstroms. As used herein, a high κ dielectric may be, for example, a dielectric with a dielectric constant κ greater than about 3.9, 10, or 20. The metal layer 116 overlies the first dielectric layer 114. In some embodiments, the metal layer 116 may, for example, be or comprise titanium nitride (TiN), titanium (Ti), tantalum (Ta), tantalum nitride (TaN), or any combination of the foregoing formed to a thickness of approximately 10 Angstroms, 30 Angstroms, or within a range of approximately 5 Angstroms to approximately 40 Angstroms. The FUSI layer 118 overlies the metal layer 116. In some embodiments, the FUSI layer 118 may, for example, be or comprise nickel silicide, cobalt silicide, titanium silicide, copper silicide, or the like formed to a thickness of approximately 150 Angstroms, 169 Angstroms, 200 Angstroms, 250 Angstroms, or within a range of approximately 125 Angstroms to approximately 325 Angstroms.

The gate structure 121 is defined within a center region 214a. In some embodiments, the center region 214a is centered at a midpoint of the gate structure 121 (e.g., a midpoint of the FUSI layer 118). A first outer region 214b and a second outer region 214c are defined on opposite sides of the center region 214a. The FUSI layer 118 is defined within the center region 214a. An entire thickness of the FUSI layer 118 is silicided, so that no unsilicided polysilicon material exists between a top and bottom surface of the FUSI layer 118. The first and second outer regions 214b, 214c respectively comprise a polysilicon layer 204 overlying the metal layer 116. In some embodiments, the polysilicon layer 204 may, for example, be or comprise polysilicon formed to a thickness of approximately 150 Angstroms, 300 Angstroms, or within a range of approximately 125 Angstroms to approximately 500 Angstroms. In some embodiments, a bottom layer of the polysilicon layer 204 is aligned with a bottom layer of the FUSI layer 118 and a thickness of the polysilicon layer 204 is greater than a thickness of the FUSI layer 118. In some embodiments, the thickness of the polysilicon layer 204 is approximately 10 percent, 25 percent, 50 percent or 75 percent thicker than the thickness of the FUSI layer 118. In some embodiments, a portion of the polysilicon layer 204 is partially or fully silicided with a conductive material from the FUSI layer 118.

A masking layer 210 overlies the polysilicon layer 204. In some embodiments (not shown), the masking layer 210 may extend from directly over the polysilicon layer 204 to directly over the FUSI layer 118. In some such embodiments, the FUSI layer 118 may have angled outer sides (i.e. defining an angled interface between the FUSI layer 118 and the polysilicon layer 204) that cause a width of the FUSI layer 118 to increase as a distance from the substrate 101 increases. In some embodiments, the masking layer 210 may, for example, be or comprise silicon nitride (SiN), silicon carbide (SiC), silicon oxide (SiO$_2$), or any combination of the foregoing formed to a thickness of approximately 150 Angstroms, 250 Angstroms, or within a range of approximately 100 Angstroms to approximately 350 Angstroms. The second dielectric layer 212 overlies the masking layer 210.

The first and second outer regions 214b, 214c respectively comprise a first contact region 209a and a second contact region 209b. The first and second contact regions 209a, 209b respectively comprise a third dielectric layer 206 surrounded by a U-shaped etch stop layer 208. In some embodiments, the center region 214a and the gate structure 121 are defined between inner sidewalls of the first and second contact regions 209a, 209b. A first source/drain region 102 and a second source/drain region 104 are respectively disposed within the substrate 101 directly below the first and second contact regions 209a, 209b. A first silicide region 102a and a second silicide region 104a are respectively disposed above the first and second source/drain regions 102, 104. In some embodiments, the first and second source/drain regions 102, 104 have a first doping type opposite the doping type of the substrate 101. An isolation structure 202 extends into an upper or top surface of the substrate 101 to provide electrical isolation between the MOSFET device 122 and neighboring devices. The isolation structure 202 includes a pair of isolation segments respectively on opposite sides of the MOSFET device 122. In some embodiments, the isolation structure 202 comprises a dielectric material, and/or is a shallow trench isolation (STI) structure, a deep trench isolation structure (DTI), or some other suitable isolation structure.

Figure 3:
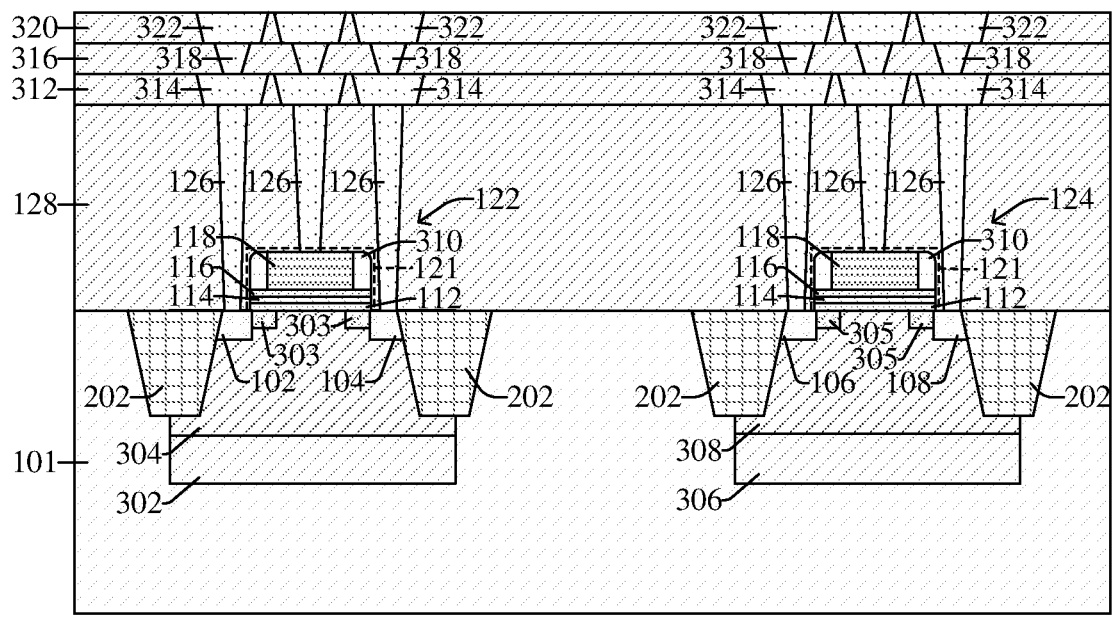
FIGS. 3 and 4 illustrate cross-sectional views of some embodiments of an IC including a pair of MOSFET devices respectively with a thin FUSI layer over a metal layer.

Referring to FIG. 3, a cross-sectional view of some embodiments of an IC 300 comprising a first MOSFET device 122 and a second MOSFET device 124.

The IC 300 includes a substrate 101 with first and second MOSFET devices 122, 124 disposed over and within the substrate 101. In some embodiments, the substrate 101 is doped with an N dopant or with a P dopant. A first well region 304 and a second well region 308 respectively overlie a first deep well region 302 and second deep well region 306 within the substrate 101. First source/drain extension regions 303 are disposed along an inner sidewall of the first and second source/drain regions 102, 104 respectively. The first source/drain extension regions 303 comprise the same dopant as the first and second source/drain regions 102, 104 at a lower concentration. Second source/drain extension regions 305 are disposed along an inner sidewall of the third and fourth source/drain regions 106, 108 respectively. The second source/drain extension regions 305 comprise the same dopant as the third and fourth source/drain regions 106, 108 at a lower concentration.

In some embodiments, the first and second source/drain regions 102, 104 respectively comprise a first dopant type (e.g., P-type or N-type). The first well region 304 and first deep well region 302 respectively comprise a second dopant. The first dopant is opposite the second dopant. In some embodiments, the third and fourth source/drain regions 106, 108 respectively comprise a third dopant. The second well region 308 and second deep well region 306 respectively comprise a fourth dopant. The third dopant is opposite the fourth dopant. In some embodiments, the first and third dopants are the same or opposite, or the first and fourth dopants are the same or opposite. Thus, in some embodiments, the first MOSFET device 122 is N-type and the second MOSFET device 124 is P-type, or vice versa. In some embodiments, the first and second MOSFET devices 122, 124 are both either N-type or P-type.

The first and second MOSFET devices 122, 124 respectively comprise a gate structure 121. The gate structure 121 comprises a gate dielectric layer 112, a first dielectric layer 114, a metal layer 116, a FUSI layer 118, and a second sidewall spacer 310. The gate dielectric layer 112 is in direct contact with the substrate 101. The first dielectric layer 114 is disposed over the gate dielectric layer 112. The metal layer 116 is disposed over the first dielectric layer 114. The FUSI layer 118 is disposed over the metal layer 116. The second sidewall spacer 310 comprises two segments disposed over the metal layer 116 on opposite sides of the FUSI layer 118. The two segments of the second sidewall spacer 310 sandwich the FUSI layer 118. In some embodiments, the second sidewall spacer 310 may, for example, be or comprise SiN, SiC, SiO), or any combination of the foregoing. A first ILD layer 128 is disposed over the first and second MOSFET devices 122, 124 and the substrate 101.

First conductive contacts 126 respectively overlie the FUSI layer 118 and the source/drain regions (first, second, third, and fourth source/drain regions 102, 104, 106, and 108) of the first and second MOSFET devices 122, 124. The first conductive contacts 126 may, for example, be or comprise tungsten (W), copper (Cu), aluminum (Al), a combination of the aforementioned, or the like. First conductive wires 314 respectively overlie the first conductive contacts 126 and are disposed within a second ILD layer 312. The first conductive wires 314 may, for example, be or comprise Cu, Al, a combination of the aforementioned, or the like. Second conductive vias 318 respectively overlie the first conductive wires 314 and are disposed within a third ILD layer 316. The second conductive vias 318 may, for example, be or comprise Cu, Al, a combination of the aforementioned, or the like. Second conductive wires 322 respectively overlie the second conductive vias 318 and are disposed within a fourth ILD layer 320. The second conductive wires 322 may, for example, be or comprise Cu, Al, a combination of the aforementioned, or the like.

Figure 4:
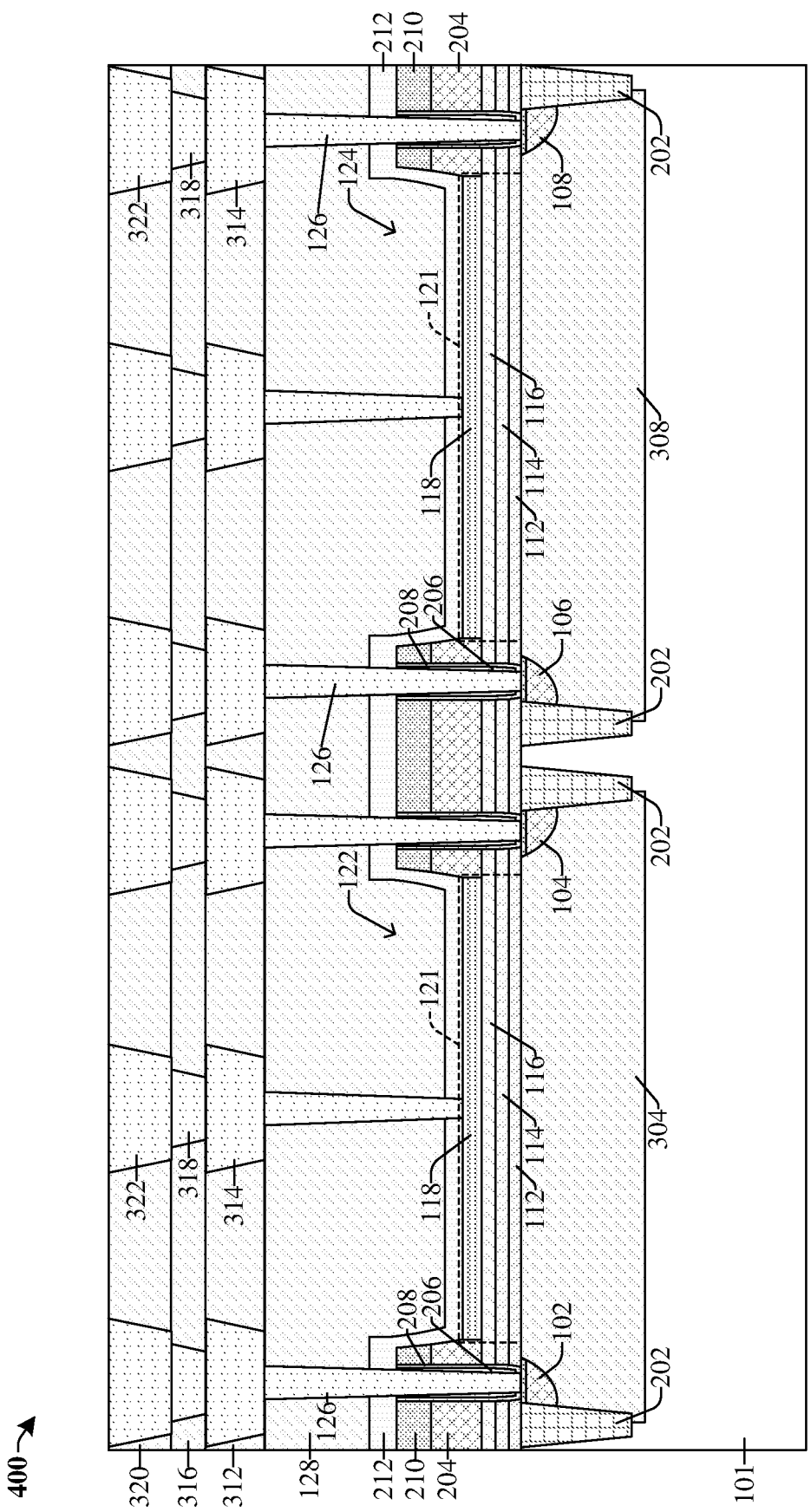

Referring to FIG. 4, a cross-sectional view of some embodiments of an IC 400 comprising a first MOSFET device 122 and a second MOSFET device 124. The first and second MOSFET devices 122 and 124 are each as the MOSFET device 122 of FIG. 2 is illustrated and described, whereby the first and second MOSFET devices 122, 124 each comprises a FUSI layer 118 and a metal layer 116. Additionally, the first and second MOSFET devices 122, 124 respectively comprise a first and second well regions 304, 308 as described in FIG. 3. In some embodiments, the first and second MOSFET devices 122, 124 respectively comprise deep well regions disposed beneath the first and second well regions 304, 308. In some embodiments, the first MOSFET device 122 is N-type and the second MOSFET device 124 is P-type, or vice versa. In some embodiments, the first and second MOSFET devices 122, 124 are both either N-type or P-type.

FIGS. 5, 6, 7A, 8-16 illustrate cross-sectional views 500, 600, 700a, 800-1600 of some embodiments of a method of forming an IC including a MOSFET device with a FUSI layer and metal layer according to the present disclosure. Although the cross-sectional views 500, 600, 700a, 800-1600 shown in FIGS. 5, 6, 7A, 8-16 are described with reference to a method, it will be appreciated that the structures shown in FIGS. 5, 6, 7A, 8-16 are not limited to the method but rather may stand alone separate of the method. Although FIGS. 5, 6, 7A, 8-16 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
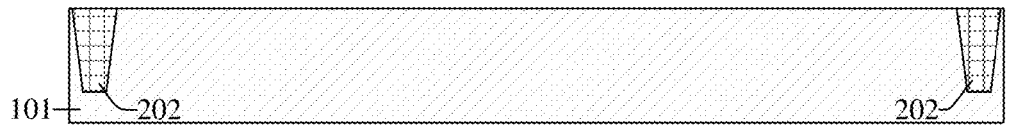
FIGS. 5, 6, 7A, 8-16 illustrate cross-sectional views of some embodiments of a method of forming a memory device including a MOSFET device with a thin FUSI layer over a metal layer, according to the present disclosure.

As shown in cross-sectional view 500 of FIG. 5, an isolation structure 202 is formed, extending into an upper or top surface of a substrate 101 to provide electrical isolation between a MOSFET device and neighboring devices. The substrate 101 may, for example, be a bulk monocrystalline silicon substrate, some other suitable bulk semiconductor substrate, a silicon-on-insulator (SOI) substrate, or some other suitable semiconductor substrate. The isolation structure 202 includes a pair of isolation segments. In some embodiments, the isolation structure 202 comprises a dielectric material, and/or is a shallow trench isolation (STI) structure, a deep trench isolation structure (DTI), or some other suitable isolation structure. In some embodiments, the forming of the isolation structure 202 comprises patterning the substrate 101 to form a trench and filling the trench with a dielectric material. In some embodiments, a well region is formed within the substrate 101 between the pair of isolation segments of the isolation structure 202. In some embodiments, a deep well region is formed beneath the well region.

Figure 6:
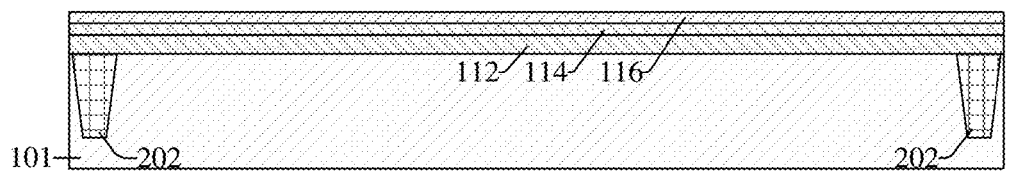

As shown in cross-sectional view 600 of FIG. 6, a gate dielectric layer 112 is formed over the substrate 101. A first dielectric layer 114 is formed over the gate dielectric layer 112. A metal layer 116 is formed over the first dielectric layer 114. The gate dielectric layer 112, first dielectric layer 114, and metal layer 116 may be formed, for example, by chemical vapor deposition (CVD), physical vapor deposition (PVD), some other suitable deposition process(es), or any combination of the foregoing.

Figure 7A:
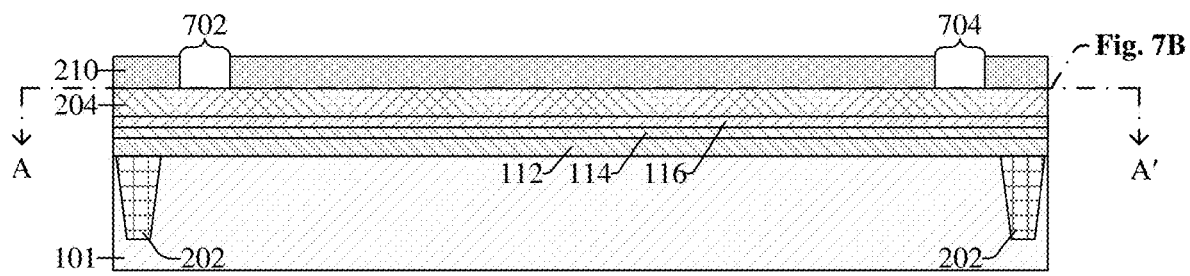

As shown in cross-sectional view 700a of FIG. 7A, a polysilicon layer 204 is formed over the metal layer 116. A masking layer 210 is formed over the polysilicon layer 204. The masking layer 210 comprises a set of two sidewalls defining a first opening 702 and a second opening 704. The first and second openings 702, 704 expose an upper surface of the polysilicon layer 204. The polysilicon layer 204, and masking layer 210 may be formed, for example, by chemical vapor deposition (CVD), physical vapor deposition (PVD), some other suitable deposition process(es), or any combination of the foregoing.

In some embodiments, the metal layer 116 may, for example, be or comprise titanium nitride (TiN). The polysilicon layer 204 forms in a uniform thickness over the metal layer 116 mitigating defects within the polysilicon layer 204 (e.g., hump defects). In some embodiments, this process ensures a plurality of MOSFET devices respectively have a substantially uniform height.

Figure 7B:
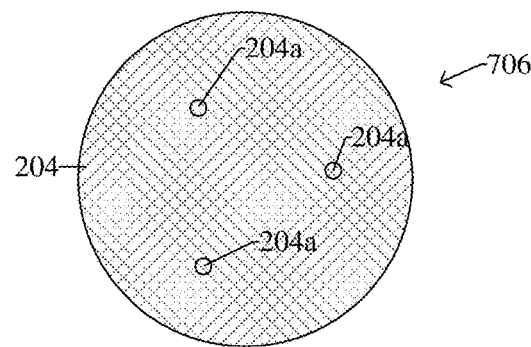
FIG. 7B illustrates a top view of some embodiments of cross-sectional view FIG. 7A including a thin polysilicon layer over a metal layer.

FIG. 7B illustrates a top-view of some additional embodiments of an IC 700b.

The IC 700b comprises a top-view of a silicon wafer 706 along a horizontal line (between A and A' of FIG. 7A) of cross-sectional view 700a of FIG. 7A. The horizontal line (between A and A' of FIG. 7A) is aligned with an upper surface of the polysilicon layer 204. A plurality of hump defects 204a are distributed across the silicon wafer 706. The plurality of hump defects 204a are raised above the upper surface of the polysilicon layer 204. The difference in height between the plurality of hump defects 204a and the upper surface of the polysilicon layer 204 is due to processing errors (e.g. grain boundaries) with forming the polysilicon layer 204 over the gate dielectric layer (112 of FIG. 7A) resulting in the plurality of hump defects 204a. In some embodiments, the plurality of hump defects 204a comprise 10 or less hump defects across the silicon wafer 706, in comparison an embodiment without the metal layer (116 of FIG. 7A) comprises 1000 or more hump defects across the silicon wafer 706. In some embodiments, there are no hump defects and the plurality of hump defects 204a are not present, resulting in the polysilicon layer 204 comprising a substantially level and uniform upper surface. In some embodiments, the polysilicon layer 204 is aligned with a horizontal line. Thus, the presence of the metal layer (116 of FIG. 7A) overcomes processing errors with the polysilicon layer 204 and results in a uniform and hump defect free upper surface across the silicon wafer 706.

Figure 8:
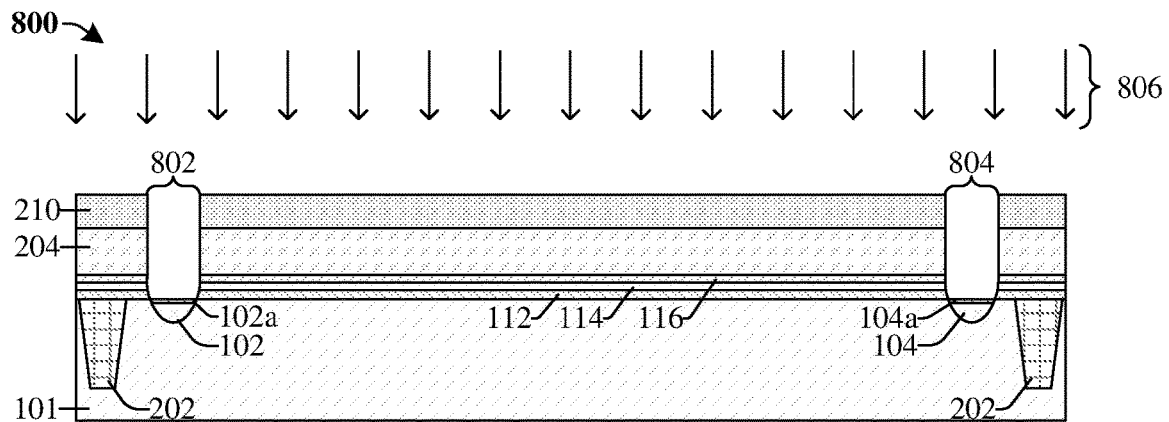

As shown in cross-sectional view 800 of FIG. 8, a patterning process is performed to remove a portion of the gate dielectric layer 112, first dielectric layer 114, metal layer 116, and polysilicon layer 204, directly below the first and second openings (702, 704 of FIG. 7A). The patterning process respectively define a first hole 802 and a second hole 804. In some embodiments, the patterning process may be performed by exposing layers underlying the first and second openings (702, 704 of FIG. 7A) to an etchant 806. The patterning process may, for example, be performed by a photolithography/etching process and/or some other suitable patterning process(es).

A first source/drain region 102 and a second source/drain region 104 are formed within the substrate 101 directly below the first and second holes 802, 804. A first silicide region 102a and a second silicide region 104a are formed within the substrate 101 directly below the first and second holes 802, 804. The first and second source/drain regions 102, 104 may, for example, be formed by ion implantation and/or some other suitable doping process(es) in which dopants are implanted into the substrate 101.

Figure 9:
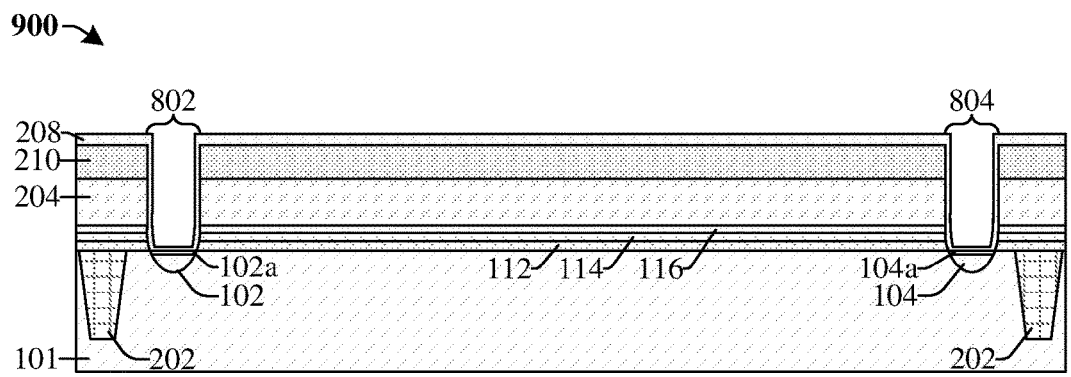

As shown in cross-sectional view 900 of FIG. 9, an etch stop layer 208 is formed over the masking layer 210 and lines an inner surface of the first and second holes 802, 804. The etch stop layer 208 has a U-shape within the first and second holes 802, 804.

Figure 10:
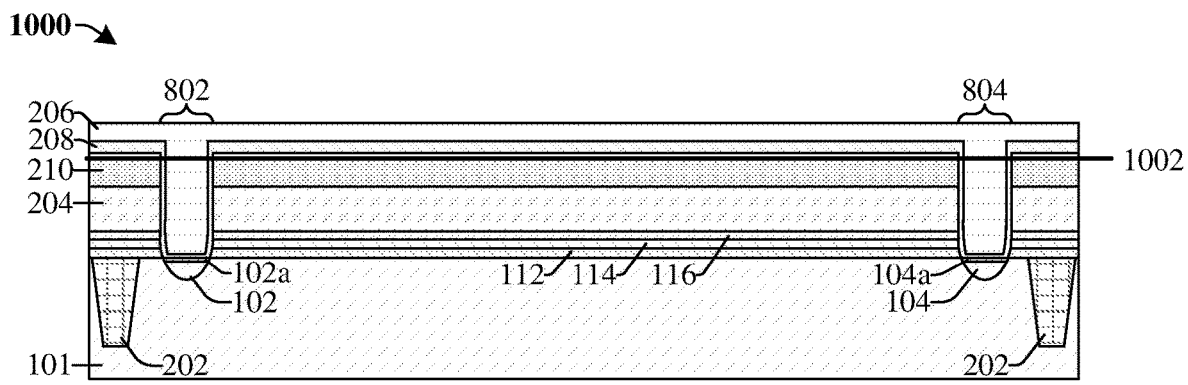
Figure 11:
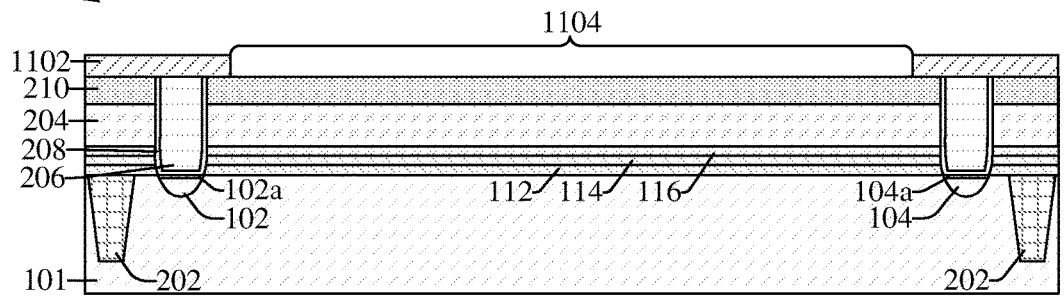

As shown in cross-sectional view 1000 of FIG. 10, a third dielectric layer 206 is formed over the etch stop layer 208. The third dielectric layer 206 completely fills the first and second holes, 802 and 804. A planarization process is performed (resulting structure is illustrated in FIG. 11) along a horizontal line 1002. The planarization process removes a portion of the masking layer 210, etch stop layer 208, and third dielectric layer 206. The planarization may, for example, be performed by a chemical mechanical planarization (CMP) process and/or some other suitable planarization process(es).

As shown in cross-sectional view 1100 of FIG. 11, a second masking layer 1102 is formed over the masking layer 210, etch stop layer 208, and the third dielectric layer 206. The second masking layer 1102 comprises sidewalls that define a third opening 1104 directly above the polysilicon layer 204.

Figure 12:
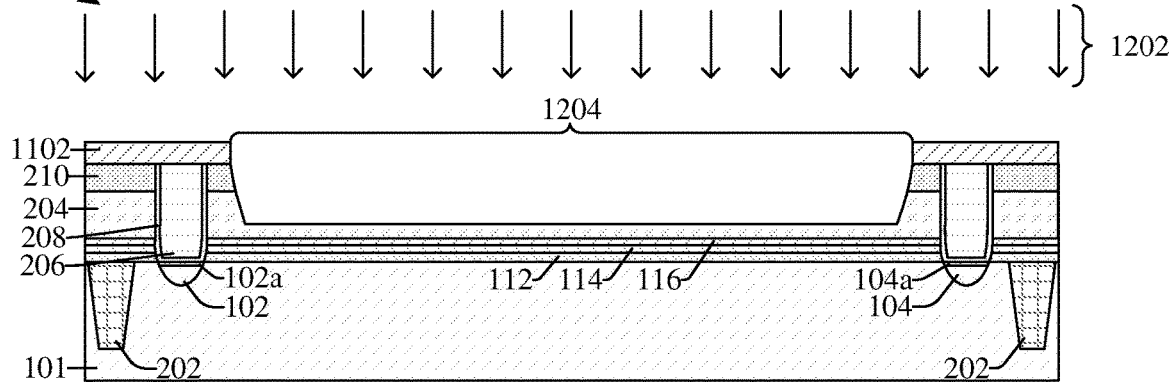

As shown in cross-sectional view 1200 of FIG. 12, a patterning process is performed to remove a portion of the masking layer 210 and the polysilicon layer 204 defining a third hole 1204. In some embodiments, the patterning process removes approximately 5 Angstroms to approximately 150 Angstroms of the polysilicon layer 204, resulting in a center portion of the polysilicon layer 204 that is less thick than outer portions of the polysilicon layer 204. In some embodiments, the patterning process may be performed by exposing the polysilicon layer 204 below the third opening (1104 of FIG. 11) to an etchant 1202. The patterning process may, for example, be performed by a photolithography/etching process and/or some other suitable patterning process(es).

Figure 13:
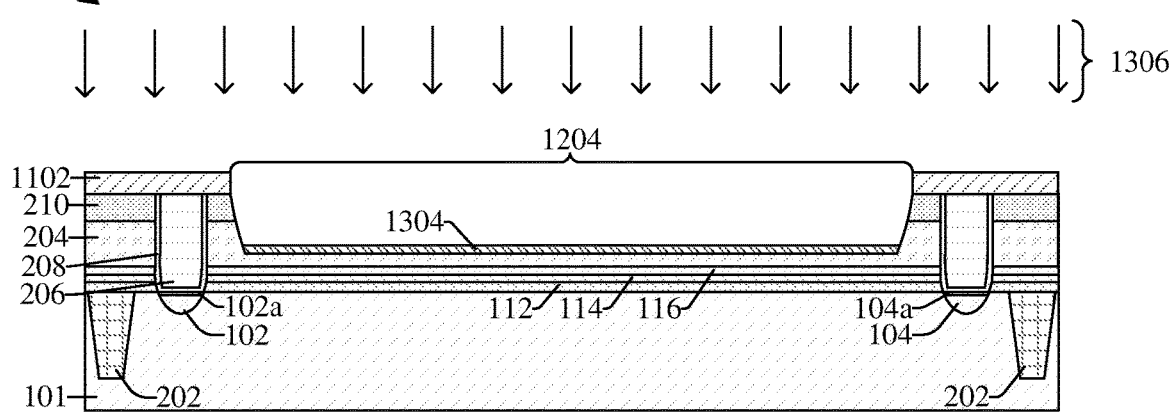

As shown in cross-sectional view 1300 of FIG. 13, a conductive layer 1304 is formed over the polysilicon layer 204 directly below the third hole 1204. In some embodiments, the conductive layer 1304 is formed over the center portion of the polysilicon layer 204 and is laterally set back from outermost sidewalls of the polysilicon layer 204 by non-zero spaces. In some embodiments, the conductive layer 1304 may, for example, be or comprise nickel, platinum, palladium, cobalt, titanium, nickel silicide (NiSi), cobalt silicide (CoSi), titanium silicide (TiSi), copper silicide (CuSi), or the like formed to a thickness of approximately 25 Angstroms, 50 Angstroms, 75 Angstroms, or within a range of approximately 5 Angstroms to approximately 150 Angstroms.

Figure 14:
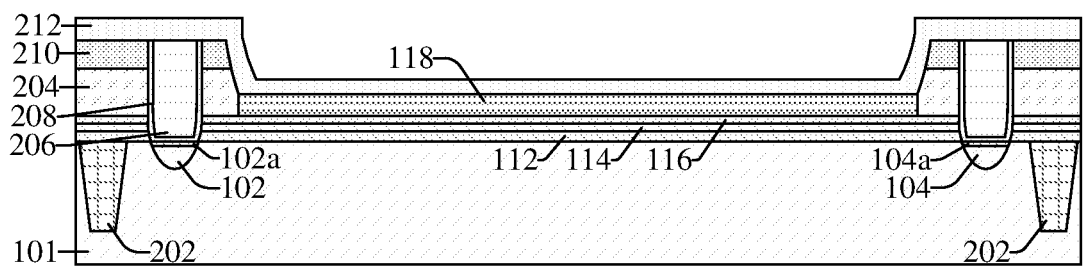

An annealing process 1306 is performed to convert the center portion of the polysilicon layer 204 and the conductive layer 1304 into a FUSI layer (118 of FIG. 14). The annealing process 1306 converts an entire thickness of the center portion of the polysilicon layer 204 into the FUSI layer (118 of FIG. 14). The FUSI layer (118 of FIG. 14) may, for example, be or comprise a silicide of NiSi, CoSi, TiSi, CuSi, or the like formed to a thickness of approximately 169 Angstroms, 150 Angstroms, 300 Angstroms, or within a range of approximately 125 Angstroms to approximately 325 Angstroms. In some embodiments, a portion of the polysilicon layer outside of the center portion (e.g. portions of the polysilicon layer 204 outside of outer sidewalls of the FUSI layer 118 of FIG. 14) is partially and/or fully silicided.

As shown in cross-sectional view 1400 of FIG. 14, the second masking layer (1102 of FIG. 13) is removed by an etching process (not shown). In some embodiments, the etching process may use a dry etchant. In other embodiments, the etching process may use a wet etchant (e.g., acetone, NMP (1-methyl-2-pyrrolidon), or the like). A second dielectric layer 212 is formed over the FUSI layer 118 and the masking layer 210.

Figure 15:
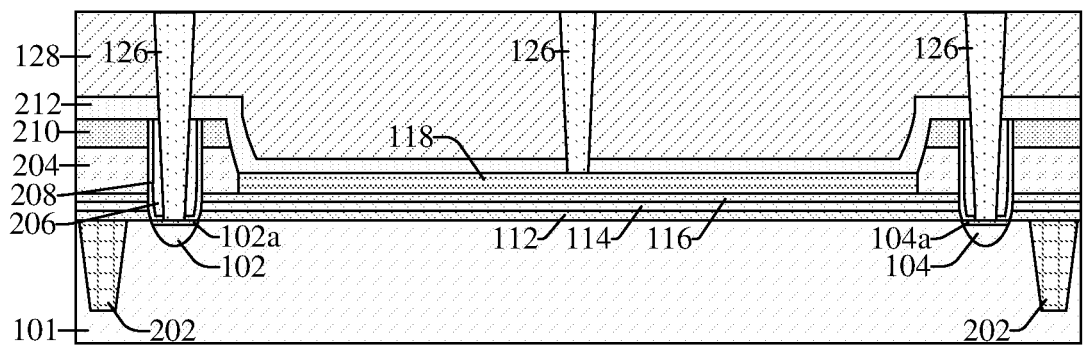

As shown in cross-sectional view 1500 of FIG. 15, a first ILD layer 128 is formed over the second dielectric layer 212. First conductive contacts 126 are respectively formed over the first source/drain region 102, second source/drain region 104, and the FUSI layer 118.

Figure 16:
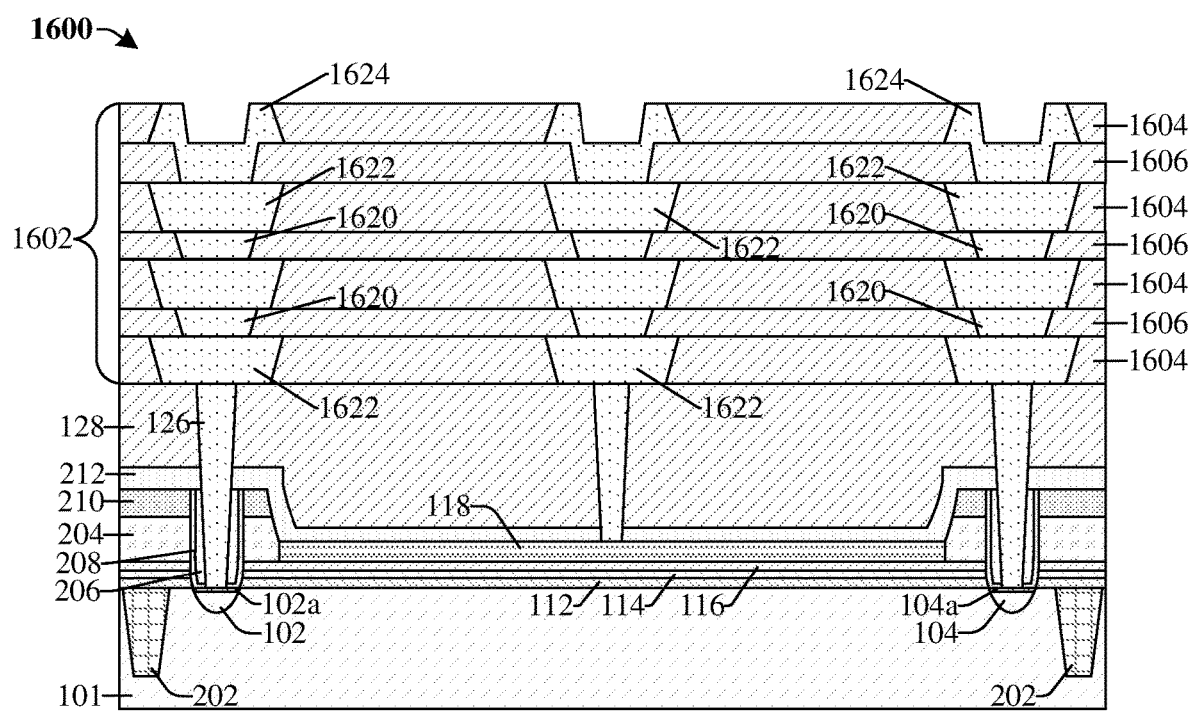

As shown in cross-sectional view 1600 of FIG. 16, an interconnect structure 1602 is formed over the structure of FIG. 15. The interconnect structure 1602 comprises ILD layers 1604, 1606, a plurality of wires 1622, a plurality of vias 1620, and a plurality of contact pads 1624. The ILD layers 1604, 1606 may, for example, be formed by CVD, PVD, some other suitable deposition process(es), or any combination of the foregoing. The plurality of wires 1622, plurality of vias 1620, and plurality of contact pads 1624 may, for example, be respectively formed by: patterning the ILD layers 1604, 1606 to form via, wire, or contact pad openings with a pattern of the vias 1620, wires 1622, or contact pads 1624; depositing a conductive layer filling the via, wire, contact pad openings and covering the ILD layers 1604, 1606; and performing a planarization into the conductive layer until the ILD layer 1604 or 1606 is reached. The patterning may, for example, be performed by a photolithography/etching process and/or some other suitable patterning process(es). The depositing may, for example, be performed by CVD, PVD, electroless plating, electroplating, some other suitable deposition process(es), or any combination of the foregoing. The planarization may, for example, be performed by a CMP and/or some other suitable planarization process(es). The plurality of wires 1622, plurality of vias 1620, and plurality of contact pads 1624 may, for example, respectively be or comprises Al, Cu, or the like. For ease of illustration, only some of the plurality of wires 1622, plurality of vias 1620, and plurality of contact pads 1624 are labeled.

Figure 17:
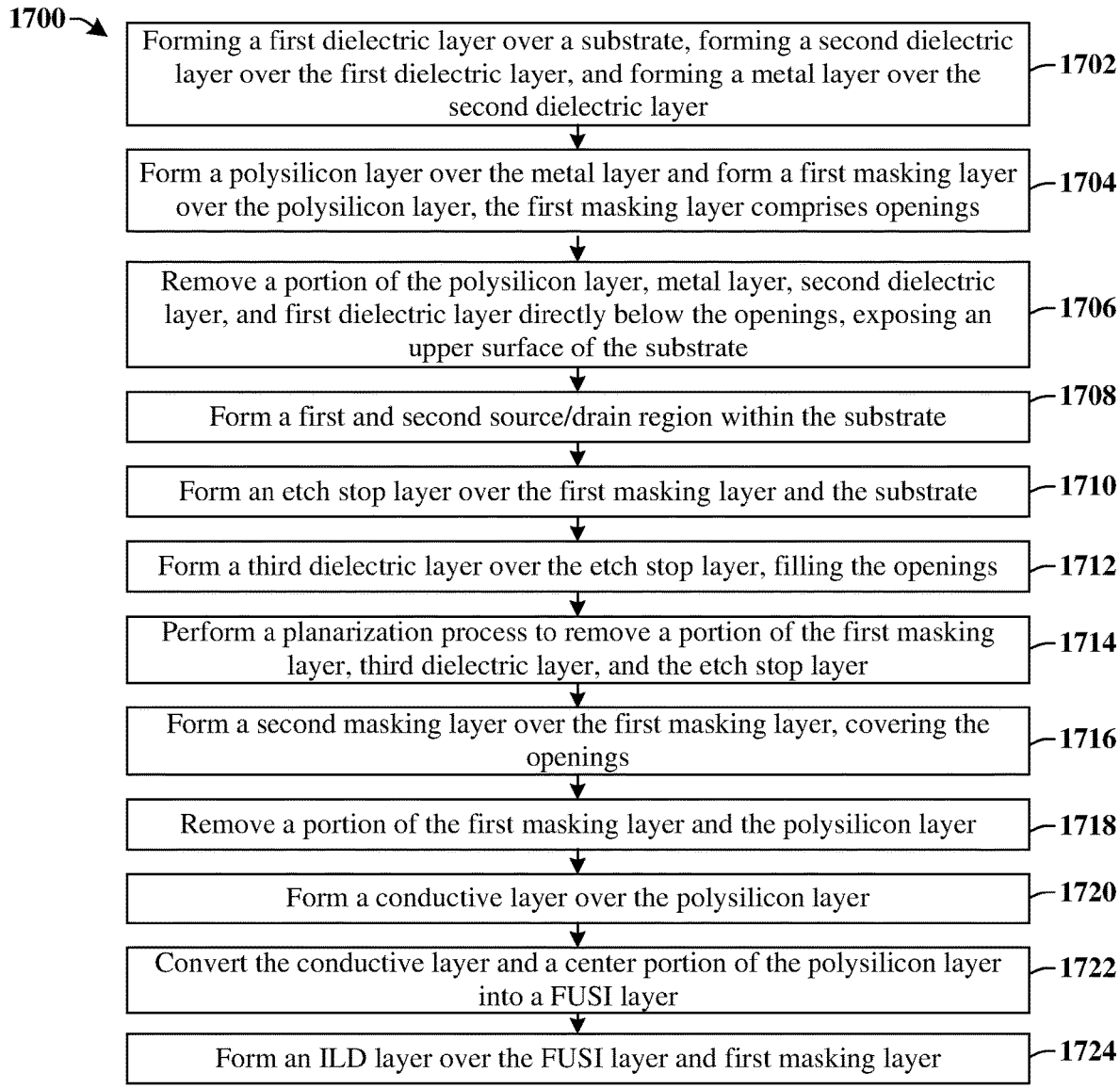
FIG. 17 illustrates a methodology in flowchart format that illustrates some embodiments of a method of forming a memory device including a MOSFET device with a thin FUSI layer over a metal layer, according to the present disclosure.

FIG. 17 illustrates a method 1700 of forming a memory device in accordance with some embodiments. Although the method 1700 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1702, a first dielectric layer is formed over a substrate, a second dielectric layer is formed over the first dielectric layer, and a metal layer is formed over the second dielectric layer. FIG. 6 illustrates a cross-sectional view 600 corresponding to some embodiments of act 1702.

At 1704, a polysilicon layer is formed over the metal layer and a first masking layer is formed over the polysilicon layer, the first masking layer defines openings. FIG. 7A illustrates a cross-sectional view 700a corresponding to some embodiments of act 1704.

At 1706, a portion of the polysilicon layer, metal layer, second dielectric layer, and first dielectric layer are removed directly below the openings exposing an upper surface of the substrate. FIG. 8 illustrates a cross-sectional view 800 corresponding to some embodiments of act 1706.

At 1708, a first and second source/drain region are formed within the substrate. FIG. 8 illustrates a cross-sectional view 800 corresponding to some embodiments of act 1708.

At 1710, an etch stop layer is formed over the first masking layer and the substrate. FIG. 9 illustrates a cross-sectional view 900 corresponding to some embodiments of act 1710.

At 1712, a third dielectric layer is formed over the etch stop layer, filling the openings. FIG. 10 illustrates a cross-sectional view 1000 corresponding to some embodiments of act 1712.

At 1714, a planarization process is performed to remove a portion of the first masking layer, third dielectric layer, and the etch stop layer. FIG. 10 illustrates a cross-sectional view 1000 corresponding to some embodiments of act 1714.

At 1716, a second masking layer is formed over the first masking layer, covering the openings. FIG. 11 illustrates a cross-sectional view 1100 corresponding to some embodiments of act 1716.

At 1718, a portion of the first masking layer and the polysilicon layer are removed. FIG. 12 illustrates a cross-sectional view 1200 corresponding to some embodiments of act 1718.

At 1720, a conductive layer is formed over the polysilicon layer. FIG. 13 illustrates a cross-sectional view 1300 corresponding to some embodiments of act 1720.

At 1722, the conductive layer and a center region of the polysilicon layer are converted into a FUSI layer. FIG. 13 illustrates a cross-sectional view 1300 corresponding to some embodiments of act 1722.

At 1724, an ILD layer is formed over the FUSI layer and first masking layer. FIG. 15 illustrates a cross-sectional view 1500 corresponding to some embodiments of act 1724.

Accordingly, in some embodiments, the present application relates to a MOSFET device that comprises a gate structure with a thin FUSI layer formed directly above a metal layer.

In some embodiments, the present application provides a method for forming a fully silicided (FUSI) gated device including: forming a masking layer onto a gate structure over a substrate, the gate structure comprising a polysilicon layer; forming a first source region and a first drain region on opposing sides of the gate structure within the substrate, wherein the gate structure is formed before the first source and drain regions; performing a first removal process to remove a portion of the masking layer and expose an upper surface of the polysilicon layer, wherein the first source and drain regions are formed before the first removal process; forming a conductive layer directly contacting the upper surface of the polysilicon layer after the first removal process; and converting the conductive layer and polysilicon layer into a FUSI layer.

In some embodiments, the present application provides a method for forming a fully silicided (FUSI) gated structure including: forming a masking layer over a gate structure comprising a polysilicon layer, wherein the masking layer comprises two sets of sidewalls respectively defining openings; selectively etching the polysilicon layer according to the masking layer to remove a portion of the gate structure directly below the openings; forming a first source/drain region and a second source/drain region within a substrate below the openings; forming a first dielectric layer over the masking layer, wherein the first dielectric layer fills the openings; performing a planarization process to remove a portion of the masking layer and the first dielectric layer; performing a first etch to selectively remove parts of the masking layer and the polysilicon layer according to a second masking layer over the first masking layer and covering the openings; forming a conductive layer over the polysilicon layer; and performing an annealing process to convert the conductive layer and polysilicon layer into a silicide layer.

In some embodiments, the present application provides a fully silicided (FUSI) gated device including: a well region disposed within a substrate; a first dielectric layer in contact with the substrate; a high κ dielectric layer overlying the first dielectric layer; a metal layer overlying the high κ dielectric layer; a FUSI layer overlying the metal layer; and a polysilicon layer arranged along opposing sides of the FUSI layer, wherein a bottom surface of the polysilicon layer is aligned with a bottom surface of the FUSI layer, wherein the polysilicon layer has a greater thickness than the FUSI layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, comprising:
forming a stack of gate layers over a substrate, wherein the stack of gate layers comprises a first dielectric layer on the substrate, a conductive layer on the first dielectric layer, and a polysilicon layer on the conductive layer;
forming a pair of source/drain regions on opposing sides of a central region of the polysilicon layer; and
converting the central region of the polysilicon layer to a first silicide layer, wherein the first silicide layer is spaced between inner sidewalls of the polysilicon layer, wherein the inner sidewalls of the polysilicon layer comprise a first sidewall, wherein a lower vertical segment of the first sidewall physically contacts the first silicide layer, wherein an upper slanted segment of the first sidewall is vertically above a top surface of the first silicide layer, wherein the upper slanted segment of the first sidewall contacts and continuously extends from the lower vertical segment of the first sidewall to an upper surface of the polysilicon layer.

2. The method of claim 1, further comprising:
forming second silicide layers on the pair of source/drain regions, wherein the second silicide layers are formed before the first silicide layer.

3. The method of claim 1, further comprising:
forming a second dielectric layer over the polysilicon layer, wherein opposing sidewalls of the second dielectric layer are aligned with the inner sidewalls of the polysilicon layer.

4. The method of claim 1, wherein the inner sidewalls of the polysilicon layer comprise a second sidewall opposite the first sidewall, wherein an upper slanted segment of the second sidewall is vertically above the top surface of the first silicide layer, and wherein the first silicide layer continuously extends along a lateral distance between the upper slanted segment of the first sidewall and the upper slanted segment of the second sidewall.

5. The method of claim 1, wherein the inner sidewalls of the polysilicon layer are spaced between the pair of source/drain regions.

6. The method of claim 1, further comprising:
depositing an upper dielectric layer over the first silicide layer, wherein the upper dielectric layer continuously extends from the inner sidewalls of the polysilicon layer to the top surface of the first silicide layer.

7. The method of claim 1, wherein a width of the first silicide layer is less than a width of the conductive layer, wherein a height of the first silicide layer is greater than a height of the conductive layer.

8. The method of claim 1, further comprising:
forming a conductive contact on the first silicide layer, wherein a bottom surface of the conductive contact is disposed below the upper surface of the polysilicon layer.

9. A method for forming an integrated chip, comprising:
depositing a gate dielectric layer and a conductive layer over a substrate;
depositing a polysilicon layer over the conductive layer;
depositing a first dielectric layer on the polysilicon layer;
performing a patterning process on the first dielectric layer and a middle region of the polysilicon layer;
forming a silicide layer on the conductive layer, wherein a segment of the polysilicon layer abuts an outer sidewall of the silicide layer;
etching the first dielectric layer and the polysilicon layer to form openings over the substrate;
forming a pair of source/drain regions in the substrate on opposing sides of the silicide layer; and
depositing a second dielectric layer lining the openings, wherein the second dielectric layer contacts first sidewalls of the first dielectric layer, first sidewalls of the polysilicon layer, and first sidewalls of the conductive layer.

10. The method of claim 9, wherein a bottom surface of the silicide layer is aligned with a bottom surface of the polysilicon layer.

11. The method of claim 9, wherein forming the silicide layer comprises:
forming a metal layer on the middle region of the polysilicon layer; and
performing an annealing process to convert the middle region of the polysilicon layer into the silicide layer.

12. The method of claim 9, wherein the patterning process defines opposing inner sidewalls in the first dielectric layer and opposing inner sidewalls in the polysilicon layer that are respectively aligned.

13. The method of claim 9, wherein the segment of the polysilicon layer is at least partially silicided.

14. The method of claim 9, wherein a height of the segment is greater than a height of a center region of the silicide layer.

15. The method of claim 9, wherein the gate dielectric layer and the conductive layer directly underlie the segment of the polysilicon layer.

16. The method of claim 9, wherein the polysilicon layer continuously extends from the second dielectric layer to the silicide layer.

17. An integrated chip, comprising:
a gate dielectric structure over a substrate;
a first conductive layer over the gate dielectric structure;
a second conductive layer directly contacting a top surface of the first conductive layer;
a pair of source/drain regions disposed in the substrate, wherein the second conductive layer is between the pair of source/drain regions; and
a polysilicon layer contacting opposing sidewalls of the second conductive layer, wherein the polysilicon layer directly contacts the top surface of the first conductive layer, wherein a top surface of the polysilicon layer is above a top surface of the second conductive layer, wherein the polysilicon layer is disposed on opposing sides of each source/drain region in the pair of source/drain regions.

18. The integrated chip of claim 17, wherein a width of the first conductive layer is greater than a width of the second conductive layer.

19. The integrated chip of claim 17, wherein the first conductive layer is disposed on the opposing sides of each source/drain region in the pair of source/drain regions.

20. The integrated chip of claim 17, wherein the first conductive layer comprises a first material different from a second material of the second conductive layer, wherein the first material and the second material are different from a third material of the polysilicon layer.

* * * * *